(12) United States Patent
Ishii et al.

(10) Patent No.: US 9,018,756 B2
(45) Date of Patent: Apr. 28, 2015

(54) SEMICONDUCTOR DEVICE

(71) Applicant: Mitsubishi Electric Corporation, Chiyoda-ku, Tokyo (JP)

(72) Inventors: Ryuichi Ishii, Tokyo (JP); Noriyuki Besshi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 62 days.

(21) Appl. No.: 14/039,509

(22) Filed: Sep. 27, 2013

(65) Prior Publication Data

US 2014/0367845 A1 Dec. 18, 2014

(30) Foreign Application Priority Data

Jun. 18, 2013 (JP) .................... 2013-127134

(51) Int. Cl.
 *H01L 23/34* (2006.01)
 *H01L 23/373* (2006.01)

(52) U.S. Cl.
 CPC .................. *H01L 23/3736* (2013.01)

(58) Field of Classification Search
 USPC ........... 257/625, E33.075, E31.131, E23.051, 257/E23.08–E23.113, 100, 433, 434, 257/787–796, E31.117–E31.118, E51.02, 257/E23.116–E23.14, E21.502–E21.504, 257/666–677, E23.031–E23.059, 678–733, 257/774, E23.001, E23.194, E23.181, 257/E21.41, E21.629, E21.643, 135–163, 257/242, 329, E27.095–E27.096, E29.118, 257/E27.274, E29.313, E29.318, E29.262, 257/778, 771, 777, 780; 438/136, 137, 156, 438/173, 192, 206, 212, 15, 26, 51, 64, 106, 438/124–127, 122

See application file for complete search history.

(56) References Cited

U.S. PATENT DOCUMENTS

| 2011/0309512 | A1  | 12/2011 | Gejima et al. |        |
|--------------|-----|---------|---------------|--------|
| 2013/0135824 | A1* | 5/2013  | Harubeppu et al. | 361/709 |
| 2013/0264702 | A1* | 10/2013 | Nishi et al. | 257/712 |

FOREIGN PATENT DOCUMENTS

| JP | 2005150309 A | 6/2005 |
| JP | 2006-004961 A | 1/2006 |
| JP | 200891959 A | 4/2008 |
| JP | 200988476 A | 4/2009 |
| JP | 201264801 A | 3/2012 |
| JP | 2013115297 A | 6/2013 |

OTHER PUBLICATIONS

Communication dated Jul. 8, 2014, issued by the Japan Patent Office in corresponding Japanese Application No. 2013-127134.

* cited by examiner

*Primary Examiner* — Dao H Nguyen
*Assistant Examiner* — Tram H Nguyen
(74) *Attorney, Agent, or Firm* — Sughrue Mion, PLLC; Richard C. Turner

(57) ABSTRACT

Stress relief layers are each provided on each circuit on an insulating substrate in a semiconductor module; a metal base coming into contact with the semiconductor module is divided into a thinned and low stiffened first metal base and a thickened and high stiffened second metal base; and the semiconductor module is bonded to the first metal base and then the first and the second metal bases are bonded to be integrated.

11 Claims, 1 Drawing Sheet

SEMICONDUCTOR DEVICE

BACKGROUND OF THE INVENTION

1. Field of the Invention

The present invention relates to a semiconductor device for use in, for example, a power converter to be mounted on a mobile object such as an automobile and, more particularly, relates to a structure and a mounting method of a power semiconductor module for use in an inverter or the like.

2. Description of the Related Art

FIG. 3 is a typical view of cross sectional structure of a general power semiconductor module which is for use in, for example, a power converter. In FIG. 3, a semiconductor switching element (hereinafter, referred to as merely "semiconductor element") 1 such as an insulated gate bipolar transistor (IGBT) and a free wheel diode 2 are bonded by soldering to an upper circuit 3 on an insulating member 5; and a lower circuit 4 on the insulating member 5 is bonded to a metal base 13 formed with fins 12 via a bonding layer 10 of solder or sintering material.

A cover 14 is fixed to the metal base 13 and thus cooling water passages are formed; and the fins 12 are directly cooled and thus a reduction in thermal resistance from the semiconductor element 1 and the free wheel diode 2 to cooling water is achieved.

Furthermore, in Patent Document 1, a lower circuit of an insulating substrate is omitted and an insulating substrate is bonded to a low stiffened and soft metal base with fins and thus a reduction in thermal resistance and high reliability are achieved.

PATENT DOCUMENT

[Patent Document 1] Japanese Unexamined Patent Publication No. 2006-4961

A conventional power semiconductor module is of a structure in which an insulating substrate, for example, a silicon nitride substrate to which a semiconductor element and a free wheel diode are fixed by means of solder bonding or the like is bonded on a metal base such as copper or aluminum by means of solder bonding or the like.

The power semiconductor module repeats heat generation and cooling by operation and accordingly each member in the module repeats linear expansion in accordance with the linear expansion coefficient of the member.

Generally, metal such as copper or aluminum that constitutes the metal base is considerably different in linear expansion coefficient from silicon nitride, aluminum nitride, or the like that constitutes the insulating substrate.

Incidentally, the circuit to be formed on the insulating substrate is formed of metal such as copper and aluminum; however, thickness is this and stiffness is low and thus it hardly has an affect on linear expansion of the insulating substrate. Therefore, maximum heat distortion is generated in the bonding layer such as a soldering layer that bonds the metal base and the insulating substrate.

Furthermore, the strength of a high stiffened metal base needs to be reduced in order to secure reliability of the bonding layer such as the soldering layer; however, vibration resistance deteriorates in that case and accordingly there arises a problem that it cannot bear against in-vehicle vibration due to strength shortage of the metal base.

BRIEF SUMMARY OF THE INVENTION

The present invention has been made to solve the problem as described above, and an object of the present invention is to provide a high reliability semiconductor device capable of establishing vibration resistance while reducing distortion of a bonding layer between a metal base and an insulating substrate in a semiconductor device provided with a power semiconductor module.

According to one aspect of the present invention, there is provided a semiconductor device including a power semiconductor module and a metal base. The power semiconductor module is made up of: an insulating substrate having an upper circuit and a lower circuit, which are mounted on the upper surface and the lower surface, respectively, of an insulating member and are each formed of a first metal material; a semiconductor element bonded to the upper circuit on the insulating substrate and electrically connected to control conduction and non-conduction of current by ON/OFF switching operation; and a resin case designed to protect the semiconductor element and the insulating substrate. The metal base is designed to cool the semiconductor element in the power semiconductor module by coming into contact with cooling media provided on a surface opposite to a bonding surface to be bonded to the lower circuit on the insulating substrate via a bonding layer. The semiconductor device further includes stress relief layers each formed of a second metal material, each stress relief layer being formed between the insulating member and the upper circuit and between the insulating member and the lower circuit of the insulating substrate.

Furthermore, according to another aspect of the present invention, there is provided a semiconductor device including a power semiconductor module and a metal base. The power semiconductor module is made up of: an insulating substrate having an upper circuit and a lower circuit, which are mounted on the upper surface and the lower surface, respectively, of an insulating member and are each formed of a first metal material; a semiconductor element bonded to the upper circuit on the insulating substrate and electrically connected to control conduction and non-conduction of current by ON/OFF switching operation; and a resin case designed to protect the semiconductor element and the insulating substrate. The metal base is designed to cool the semiconductor element in the power semiconductor module by coming into contact with cooling media provided on a surface opposite to a bonding surface to be bonded to the lower circuit on the insulating substrate via a bonding layer. In the semiconductor device, the first metal material is copper; and the metal base is made up of a first metal base whose thickness is thinned so as to be low stiffness and a second metal base whose thickness is thickened so as to be high stiffness, the first metal base being connected to the lower circuit on the insulating substrate via the bonding layer of solder or sintering material, and the first metal base and the second metal base being bonded to be integrated by joining means.

According to a semiconductor device of the present invention, there can be obtained a high reliability semiconductor device capable of establishing vibration resistance while reducing distortion of a bonding layer between a metal base and an insulating substrate in a semiconductor device provided with a power semiconductor module.

The foregoing and other objects, features, and advantageous effects of the present invention will become more apparent from detailed description in the following embodiments and description in the accompanying drawings.

DETAILED DESCRIPTION OF THE INVENTION

Figure 1:
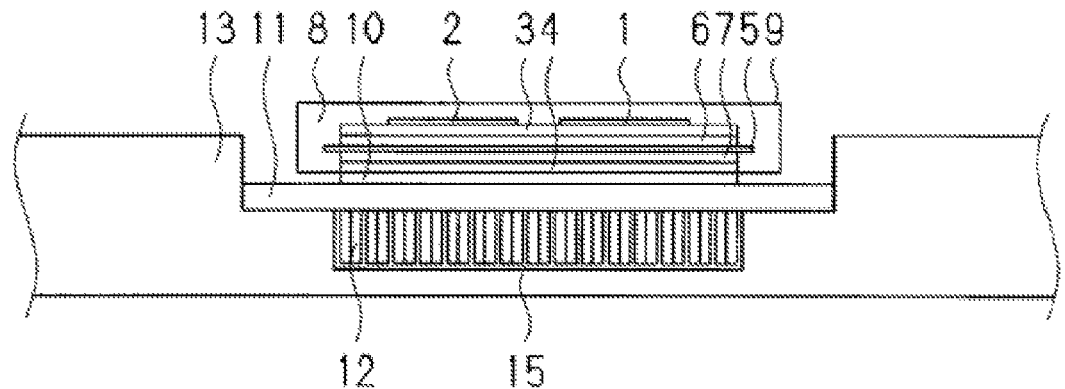
FIG. 1 is a typical view of a cross sectional structure showing a semiconductor device according to Embodiment 1 of the present invention.

Hereinafter, preferred embodiments of the present invention will be described below in detail with reference to the drawings. Incidentally, the same reference numerals as those shown in the respective drawings represent the same or corresponding elements.

Embodiment 1

FIG. 1 is a typical view of a cross sectional structure showing a semiconductor device according to Embodiment 1 of the present invention.

In FIG. 1, a power semiconductor module 9 includes: an insulating substrate in which a shock absorbing upper circuit 6 and a shock absorbing lower circuit 7, each made of pure aluminum serving as a second metal material, are brazed to the surface and the back surface, respectively, of an insulating member 5 of silicon nitride or aluminum nitride, and an upper circuit 3 and a lower circuit 4, each made of copper serving as a first metal material, are brazed to the shock absorbing upper circuit 6 and the shock absorbing lower circuit 7, respectively; a semiconductor switching element 1 and a free wheel diode 2 which are bonded to the upper circuit 3 by soldering or sintering; and a resin case 8 by which these elements are sealed.

The lower circuit 4 of the insulating substrate is connected to a thinned base 11 with fins 12, the thinned base 11 being served as a first metal base whose thickness is thinned to, for example, several mm to be low stiffened, the lower circuit 4 being connected by a bonding layer 10 of solder or sintering material; and the thinned base 11 is joined to a thickened and high stiffened second metal base 13 formed with water passages.

According to the semiconductor device of the thus configured Embodiment 1, the shock absorbing lower circuit 7 serving as a stress relief layer is pure aluminum and thus bearing force is low; and bearing force is equal to or lower even compared to the bearing force of the bonding layer 10 of solder or sintering material; and therefore, heat distortion generated in the bonding layer 10 can be reduced.

Furthermore, the insulating member 5 is sealed by the resin case 8 and therefore linear expansion of the insulating member 5 increases and the heat distortion generated in the bonding layer 10 can be reduced.

In addition, the thickness of the thinned base 11 is set to several mm and thus it becomes low stiffness and the heat distortion generated in the bonding layer 10 can be reduced.

Further, the thickened and high stiffened second metal base 13 and the thinned base 11 are fixed by welding, friction stirring joining, or screws; and thus, vibration resistance can be improved and vibration resistance of the semiconductor device can be established while reducing distortion of the bonding layer 10.

Incidentally, in a power converter such as an inverter, ordinarily, a several number of the power semiconductor modules 9 are arranged; and therefore, if not only a joining portion of the thinned base 11 and the high stiffened second metal base 13 is formed at the outer peripheral of water passages 15 but also the thinned base 11 between adjacent the power semiconductor modules 9 and a central portion of the water passage 15 are joined, further high vibration resistance can be established.

Embodiment 2

Figure 2:
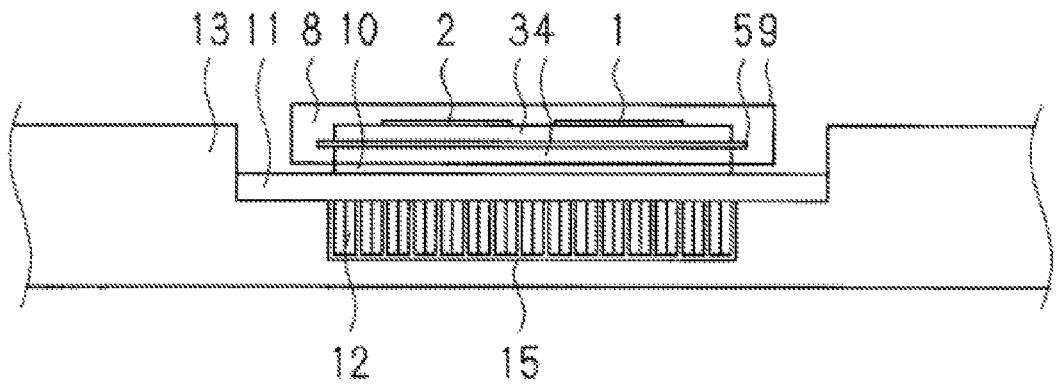
FIG. 2 is a typical view of a cross sectional structure showing a semiconductor device according to Embodiment 2 of the present invention.
Figure 3:
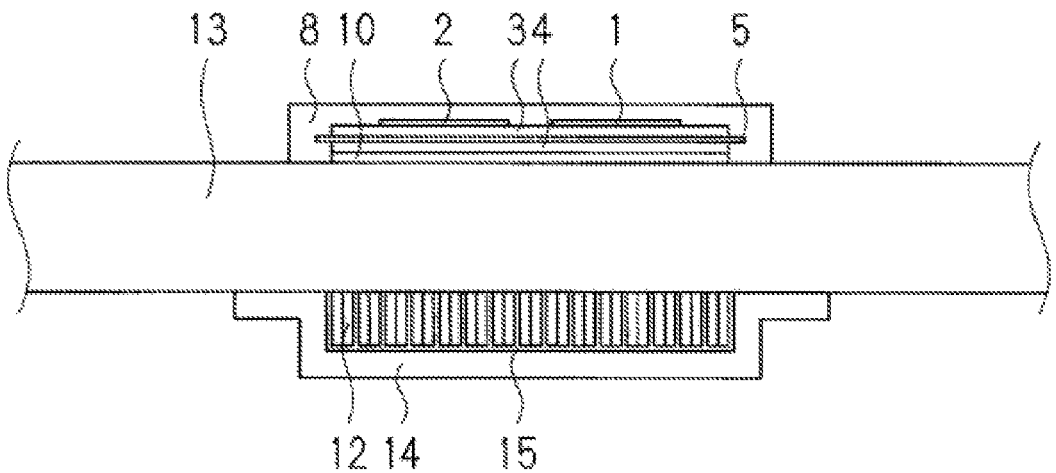
FIG. 3 is a typical view of a cross sectional structure showing a conventional semiconductor device.

FIG. 2 is a typical view of a cross sectional structure showing a semiconductor device according to Embodiment 2 of the present invention.

As shown in FIG. 2, a power semiconductor module 9 includes: an insulating substrate in which an upper circuit 3 and a lower circuit 4, each made of copper serving as a first metal material having an approximately 1 mm thickness, are brazed to the surface and the back surface, respectively, of an insulating member 5 of a thin sheet of silicon nitride or aluminum nitride; a semiconductor switching element 1 and a free wheel diode 2 which are bonded to the upper circuit 3 by soldering or sintering; and a resin case 8 by which the aforementioned constituent elements are sealed.

The lower circuit 4 of the insulating substrate is connected to a thinned base 11 with fins 12, the thinned base 11 being served as a first metal base whose thickness is thinned to, for example, several mm to he low stiffened, the lower circuit 4 being connected by a bonding layer 10 of solder or sintering material; and the thinned base 11 is joined to a thickened and high stiffened second metal base 13 formed with water passages.

According to the semiconductor device of the thus configured Embodiment 2, the following operational advantage is exhibited.

(1) The upper circuit 3 and the lower circuit 4 need to be made of copper in order to reduce thermal resistance of the power semiconductor module. In this case, in the case where the thickness of the upper circuit 3 and the lower circuit 4 is thin, it hardly has an affect on linear expansion of the insulating member 5. However, as in Embodiment 2, in the case where the upper circuit 3 and the lower circuit 4 are thickened to approximately 1 mm, the linear expansion of the insulating member 5 increases; and therefore, heat distortion generated in the bonding layer 10 can be reduced.

Furthermore, the insulating member 5 is sealed with the resin case 8; and therefore, the linear expansion of the insulating member 5 increases and thus the heat distortion generated in the bonding layer 10 can be reduced.

(2) In addition, the thickness of the thinned base 11 is set to several mm and thus it becomes low stiffness and the heat distortion generated in the bonding layer 10 can be reduced.

Further, the thickened and high stiffened second metal base 13 and the thinned base 11 are fixed by welding, friction stirring joining, or screws; and thus, vibration resistance can be improved and vibration resistance of the semiconductor device can be established while reducing distortion of the bonding layer 10.

Incidentally, in a power converter such as an inverter, ordinarily, a several number of the power semiconductor modules 9 are arranged; and therefore, if not only a joining portion of the thinned base 11 and the high stiffened second metal base 13 is formed at the outer peripheral of water passages 15 but also the thinned base 11 between adjacent the power semiconductor modules 9 and a central portion of the water passage 15 are joined, further high vibration resistance can be established.

Incidentally, in the aforementioned Embodiments 1 and 2, in the case where the thinned base 11 serving as the first metal base is bonded to the high stiffened second metal base 13 and then the lower circuit 4 of the power semiconductor module is connected, work which is the same as the size and shape of an inverter is needed; and accordingly, equipment is increased in size and is complicated and, more particularly, heat capacity is increased in the case of solder connection and bonding is extremely difficult. However, the thinned base 11 is joined or connected in advance to the lower circuit 4 of the power semiconductor module 9; and consequently, workability can be dramatically improved and a high reliability connection method can be selected.

Various modifications and alternations of this invention will be apparent to those skilled in the art without departing from the scope and spirit of this invention, and it should be understood that this is not limited to the illustrative embodiments set forth herein.

What is claimed is:

1. A semiconductor device comprising:
a power semiconductor module; and
a metal base,
said power semiconductor module being made up of:
an insulating substrate having an upper circuit and a lower circuit, which are mounted on the upper surface and the lower surface, respectively, of an insulating member and are each formed of a first metal material;
a semiconductor element bonded to said upper circuit on said insulating substrate and electrically connected to control conduction and non-conduction of current by ON/OFF switching operation; and
a resin case designed to protect said semiconductor element and said insulating substrate, and
said metal base being designed to cool said semiconductor element in said power semiconductor module by coming into contact with cooling media provided on a surface opposite to a bonding surface to be bonded to said lower circuit on said insulating substrate via a bonding layer,
said semiconductor device further comprising stress relief layers each formed of a second metal material, each stress relief layer being formed between said insulating member and said upper circuit and between said insulating member and said lower circuit of said insulating substrate.

2. The semiconductor device according to claim 1,
wherein said metal base is made up of a first metal base whose thickness is thinned so as to be low stiffness and a second metal base whose thickness is thickened so as to be high stiffness,
said first metal base being connected to said lower circuit on said insulating substrate via said bonding layer, and
said first metal base and said second metal base being bonded to be integrated by joining means.

3. The semiconductor device according to claim 2,
wherein said first metal material is copper, and
said second metal material is aluminum.

4. The semiconductor device according to claim 2
wherein said first metal base is set to a several mm thickness.

5. The semiconductor device according to claim 1,
wherein bonding between said stress relief layer and said insulating member, between said stress relief layer and said upper circuit, and between said stress relief layer and said lower circuit is performed by brazing, and
connection between said metal base and said lower circuit is performed by said bonding layer of solder or sintering material.

6. The semiconductor device according to claim 2,
wherein joining means between said first metal base and said second metal base is welding, friction stirring joining, or screws.

7. A semiconductor device comprising:
a power semiconductor module; and
a metal base,
said power semiconductor module being made up of:
an insulating substrate having an upper circuit and a lower circuit, which are mounted on the upper surface and the lower surface, respectively, of an insulating member and are each formed of a first metal material;
a semiconductor element bonded to said upper circuit on said insulating substrate and electrically connected to control conduction and non-conduction of current by ON/OFF switching operation; and
a resin case designed to protect said semiconductor element and said insulating substrate, and
said metal base being designed to cool said semiconductor element in said power semiconductor module by coming into contact with cooling media provided on a surface opposite to a bonding surface to be bonded to said lower circuit on said insulating substrate via a bonding layer,
wherein said first metal material is copper; and
said metal base is made up of a first metal base whose thickness is thinned so as to be low stiffness and a second metal base whose thickness is thickened so as to be high stiffness,
said first metal base being connected to said lower circuit on said insulating substrate is said bonding layer of solder or sintering material, and
said first metal base and said second metal base being bonded to be integrated by joining means.

8. The semiconductor device according to claim 7,
wherein said upper circuit and said lower circuit of said insulating substrate are substantially a 1 mm thickness, and
said first metal base is a several mm thickness.

9. The semiconductor device according to claim 7,
wherein joining means between said first metal base and said second metal base is welding, friction stirring joining, or screws.

10. The semiconductor device according to claim 2,
wherein said power semiconductor module is bonded to said first metal base and then said first metal base and said second metal base are bonded to be integrated by joining means.

11. The semiconductor device according to claim 7,
wherein said power semiconductor module is bonded to said first metal base and then said first metal base and said second metal base are bonded to be integrated by joining means.

* * * * *